(12) United States Patent
Kawaguchi et al.

(10) Patent No.: US 10,624,250 B2
(45) Date of Patent: Apr. 14, 2020

(54) MOUNTING PROCESSING UNIT FOR ARRANGING COMPONENTS ON A BOARD

(71) Applicant: FUJI CORPORATION, Chiryu-shi (JP)

(72) Inventors: Koji Kawaguchi, Kasugai (JP); Junichi Narita, Anjo (JP); Mitsuru Sanji, Toyota (JP); Kenzo Ishikawa, Kariya (JP)

(73) Assignee: FUJI CORPORATION, Chiryu-shi (JP)

( * ) Notice: Subject to any disclaimer, the term of this patent is extended or adjusted under 35 U.S.C. 154(b) by 197 days.

(21) Appl. No.: 15/550,646

(22) PCT Filed: Feb. 13, 2015

(86) PCT No.: PCT/JP2015/053981
§ 371 (c)(1),
(2) Date: Aug. 11, 2017

(87) PCT Pub. No.: WO2016/129105
PCT Pub. Date: Aug. 18, 2016

(65) Prior Publication Data
US 2018/0027708 A1 Jan. 25, 2018

(51) Int. Cl.
*B23P 19/00* (2006.01)
*H01M 2/04* (2006.01)
(Continued)

(52) U.S. Cl.
CPC .......... *H05K 13/08* (2013.01); *B25J 15/0616* (2013.01); *H05K 3/301* (2013.01);
(Continued)

(58) Field of Classification Search
CPC .. H05K 13/0069; H05K 13/022; H05K 13/04; H05K 13/0408; H05K 13/0417;
(Continued)

(56) References Cited

U.S. PATENT DOCUMENTS

| | | | |
|---|---|---|---|
| 6,662,438 B2 * | 12/2003 | Suhara | H05K 13/041 29/743 |
| 7,296,727 B2 * | 11/2007 | Onobori | B23K 1/0016 228/102 |

(Continued)

FOREIGN PATENT DOCUMENTS

| | | |
|---|---|---|
| EP | 1 617 717 A1 | 1/2006 |
| EP | 2 822 373 A1 | 1/2015 |

(Continued)

OTHER PUBLICATIONS

International Search Report dated Apr. 21, 2015 in PCT/JP2015/053981 filed Feb. 13, 2015.

(Continued)

*Primary Examiner* — Paul D Kim
(74) *Attorney, Agent, or Firm* — Oblon, McClelland, Maier & Neustadt, L.L.P.

(57) ABSTRACT

A mounting device is provided with a first raising and lowering drive section configured to raise and lower an entire syringe member to which a suction nozzle that picks up a component is attached, and a second raising and lowering drive section that raises and lowers the suction nozzle only of the syringe member to which the suction nozzle is attached. The mounting device controls a raising and lowering operation of the first raising and lowering drive section based on height information that includes at least one of information of the thickness of the component and information of the height of a board. With the mounting device, it is possible to move the entire syringe member to which the suction nozzle is attached to a position closer to the board in accordance with the height of the board and the thickness of the component.

7 Claims, 6 Drawing Sheets

(51) Int. Cl.
*H05K 13/08* (2006.01)
*H05K 13/04* (2006.01)
*B25J 15/06* (2006.01)
*H05K 3/30* (2006.01)

(52) U.S. Cl.
CPC ..... *H05K 13/0413* (2013.01); *H05K 13/0469* (2013.01); *H05K 13/0853* (2018.08)

(58) Field of Classification Search
CPC ............... H05K 13/0469; H05K 13/08; H05K 13/0853; H05K 3/301; B25J 15/0616
See application file for complete search history.

(56) References Cited

U.S. PATENT DOCUMENTS

| | | | |
|---|---|---|---|
| 7,849,588 B2 * | 12/2010 | Onishi | H05K 13/082 29/743 |
| 9,603,262 B2 * | 3/2017 | Hojo | H01L 24/16 |
| 2006/0200973 A1 | 9/2006 | Imafuku et al. | |
| 2007/0214629 A1 | 9/2007 | Imafuku et al. | |
| 2015/0040384 A1 | 2/2015 | Nishiyama et al. | |
| 2017/0273227 A1* | 9/2017 | Ota | H05K 13/04 |

FOREIGN PATENT DOCUMENTS

| | | | |
|---|---|---|---|
| JP | 11040737 A | * | 2/1999 |
| JP | 2001168590 A | * | 6/2001 |
| JP | 2006-147640 A | | 6/2006 |
| JP | 2016218407 A | * | 12/2016 |
| WO | 2014/080472 A1 | | 5/2014 |

OTHER PUBLICATIONS

Extended European Search Report dated Jan. 30, 2018 in Patent Application No. 15881980.5, citing documents AA-AC and AO-AP therein, 14 pages.

* cited by examiner

FIG. 8

MOUNTING PROCESSING UNIT FOR ARRANGING COMPONENTS ON A BOARD

TECHNICAL FIELD

The present disclosure relates to a mounting processing unit, a mounting device, and a control method of a mounting processing unit.

BACKGROUND ART

Conventionally, there are known mounting devices provided with a first linear motor that raises and lowers a first raising and lowering member, and a second linear motor that raises and lowers a nozzle attached to an end of the first raising and lowering member (for example, refer to patent literature 1). With this mounting device, it is possible to avoid damage due to contact impact with either the suction nozzle or board while maintaining high mounting efficiency of mounting components on boards by performing relatively precise raising and lowering with the second linear motor.

CITATION LIST

Patent Literature

Patent literature 1: WO2014/080472

SUMMARY

However, with the above mounting device, in cases such as when there is warpage in the board, or variance in the thickness of the component, it is necessary to set a relatively large margin of error, meaning that the stroke of the second linear motor when raising and lowering is long.

The present disclosure take account of such problems, and an object thereof is to provide a mounting processing unit, a mounting device, and a control method of a mounting processing unit that allows a shorter raising and lowering stroke in a configuration that raises and lowers a raising and lowering member to which a pickup member is attached and raises and lowers the pickup member.

The present disclosure uses the following to achieve the above object.

The mounting processing unit of the present disclosure is a mounting processing unit for arranging components on a board, including:

a first raising and lowering drive section configured to raise and lower an entire raising and lowering member to which a pickup member configured to pick up a component is attached;

a second raising and lowering drive section configured to raise and lower the pickup member of the raising and lowering member; and a control section configured to control at least raising and lowering operation of the first raising and lowering drive section based on height information that includes at least one of component thickness information or information of board height measured by a measuring section.

This mounting processing unit is provided with a first raising and lowering drive section configured to raise and lower an entire raising and lowering member to which a pickup member configured to pick up a component is attached, and a second raising and lowering drive section configured to raise and lower the pickup member of the raising and lowering member. And, this unit controls at least raising and lowering operation of the first raising and lowering drive section based on height information that includes at least one of component thickness information or information of board height measured by a measuring section. This unit may move the entire raising and lowering member to a position closer to the board in accordance with the board height or component thickness. Accordingly, with this unit, in a configuration for raising and lowering a raising and lowering member to which a pickup member is attached, and for raising and lowering the pickup member, it is possible to make the raising and lowering stroke of the pickup member shorter. Thus, this unit can be made more compact.

In the mounting processing unit of the present disclosure, the control section may, using the board height or the component thickness, or both the board height and the component thickness, included in the height information, control raising and lowering operation of the first raising and lowering drive section such that the raising and lowering member is positioned at a stopping position of the raising and lowering member which is such that a distance between the board and the raising and lowering member is a distance corresponding to a raising and lowering stroke of the pickup member.

With the mounting processing unit of the present disclosure, the control section may set a tip correction value used for raising and lowering control of the pickup member by the second raising and lowering drive section based on the height information, set a raising and lowering correction value larger than the tip correction value and to be used for raising and lowering control of the raising and lowering member by the first raising and lowering section, control raising and lowering operation of the first raising and lowering drive section using the raising and lowering correction value, and control operation of the second raising and lowering drive section using the tip correction value. With this unit, the position of the entire raising and lowering member is corrected, and the position of the pickup member is corrected by a smaller amount, such that the raising and lowering stroke of the pickup member is made even smaller. The tip correction value may be a correction value that corrects a reference position for a specified value in the raising and lowering range of the pickup member (such as a movement start position or a planned stop position), or may be a correction value that corrects the raising and lowering range of the pickup member itself. Also, the raising and lowering correction value may be a correction value that corrects a reference position for a specified value in the raising and lowering range of the raising and lowering member (such as a movement start position or a planned stop position), or may be a correction value that corrects the raising and lowering range of the raising and lowering member itself.

Also, with the mounting processing unit of the present disclosure, the control section may set a raising and lowering correction value that corrects the stopping position on the board of the raising and lowering member based on the height information, control raising and lowering operation of the first raising and lowering drive section by correcting a base value using the raising and lowering correction value, and control raising and lowering operation of the second raising and lowering section using a base value. With this unit, second raising and lowering drive section performs raising and lowering according to the base setting, and first raising and lowering drive section performs raising and lowering using the raising and lowering correction value, thus the raising and lowering stroke of the pickup member is shorter.

The mounting processing unit of the present disclosure may further include a detecting section configured to detect a load applied to the pickup section, and the control section, in raising and lowering control of the raising and lowering member or the pickup member or both, may measure at least one of the board height or the component thickness by detecting contact with the member to which the raising and lowering member is attached using the detecting section. With this unit, it is possible to measure the height of the board or the thickness of the component using the detecting section that detects the load applied to the pickup member. Here, a member attached to a raising and lowering member, for example, may be a pickup member, or a jig attached to the raising and lowering member instead of the pickup member. Note that, the detecting section may detect the load applied to the pickup member when the component is mounted on the board. At this time, the control section may measure the thickness of the component by contacting the component against a specified reference surface with the component held by the pickup member.

A mounting device of the present disclosure is provided with one of the above mounting processing units. Because this mounting device is provided with one of the above mounting processing units, the raising and lowering stroke of the pickup member is made even shorter.

A control method of a mounting processing unit of the present disclosure is a control method for a processing mounting unit for arranging components on a board, provided with a first raising and lowering drive section configured to raise and lower an entire raising and lowering member to which a pickup member configured to pick up a component is attached, and a second raising and lowering drive section configured to raise and lower the pickup member of the raising and lowering member, the control method including: a control step of controlling at least raising and lowering operation of the first raising and lowering drive section based on height information that includes at least one of component thickness information or information of board height measured by a measuring section.

With this control method, in the same manner as with the above mounting processing unit, it is possible to move the entire raising and lowering member to a position closer to the board in accordance with the board height or component thickness. Accordingly, with this control method, in a configuration for raising and lowering a raising and lowering member to which a pickup member is attached, and for raising and lowering the pickup member, it is possible to make the raising and lowering stroke of the pickup member shorter. Note that, in the control method of the mounting processing unit, various types of the above mounting processing unit may be used, and steps may be added to realize each function of the above mounting processing units.

DESCRIPTION OF EMBODIMENTS

Figure 1:
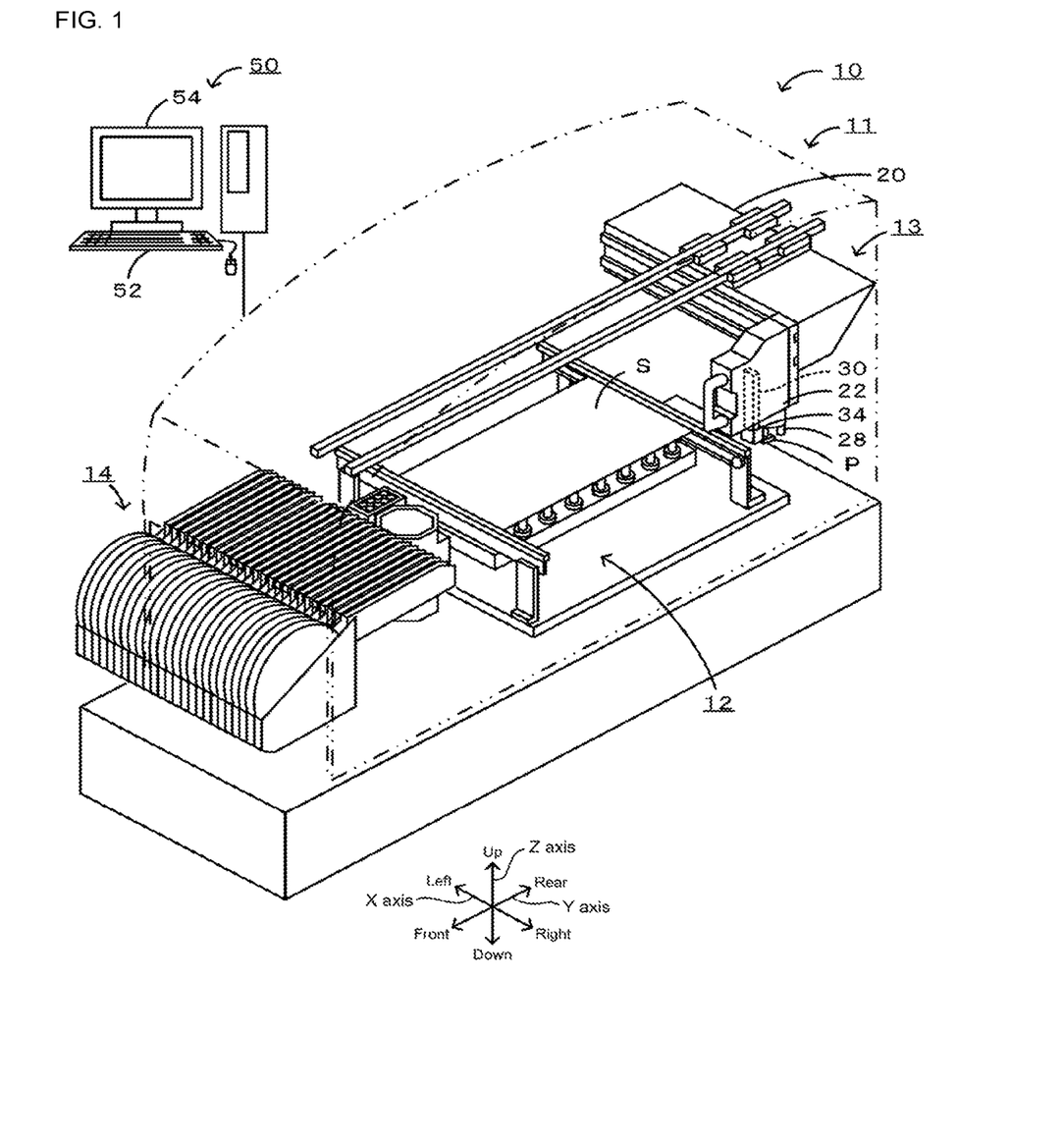
FIG. 1 is a schematic view showing an example of mounting system 10.
Figure 2:
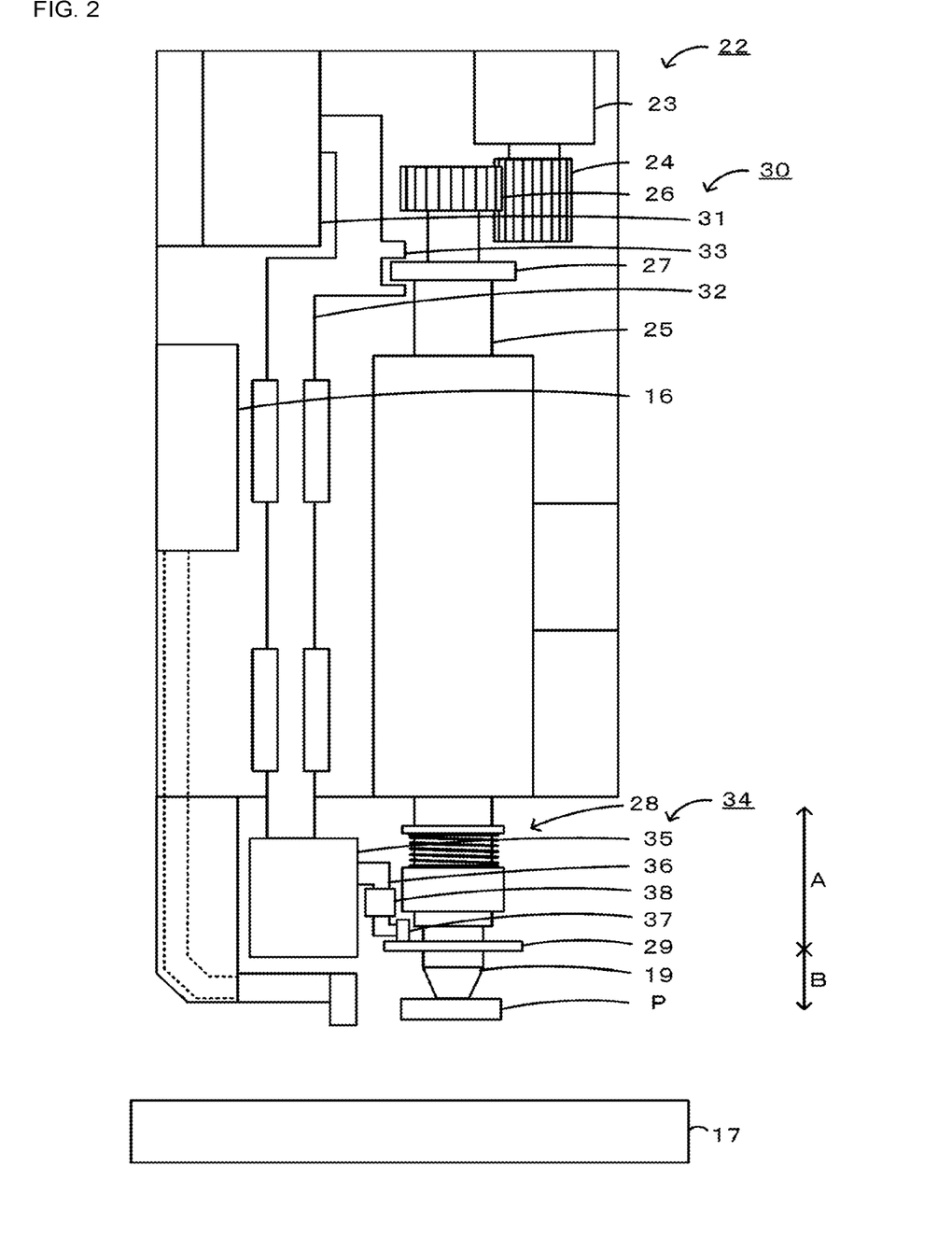
FIG. 2 shows the configuration of mounting head 22.
Figure 3:
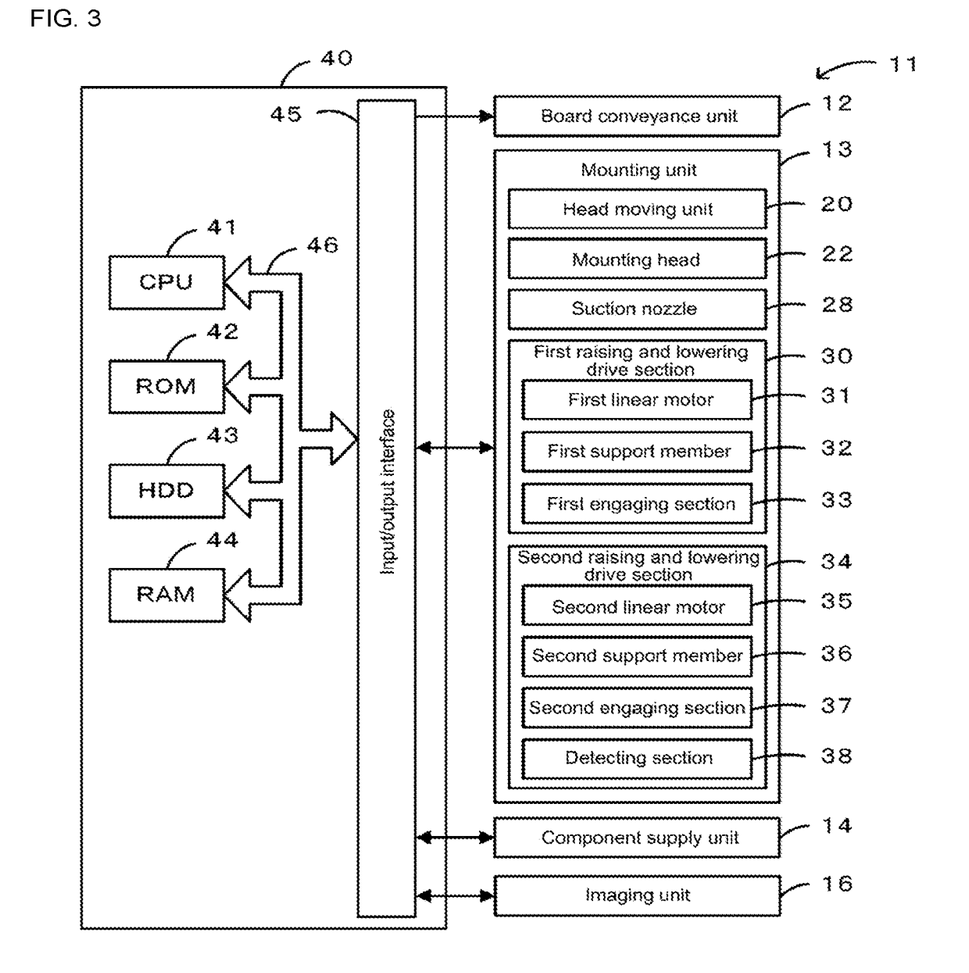
FIG. 3 is a block diagram showing the configuration of mounting device 11.

Hereinafter, an embodiment of the present disclosure will be described with reference to the figures. FIG. 1 is a schematic view showing an example of mounting system 10. FIG. 2 shows the configuration of mounting head 22. FIG. 3 is a block diagram showing the configuration of mounting device 11. Mounting system 10, for example, mounts components P on board S. Mounting system 10 is provided with mounting device 11 and management computer 50. Multiple mounting devices 11 that perform mounting processing of mounting components P on board S are arranged from upstream to downstream in mounting system 10. For ease of understanding, FIG. 1 only shows one mounting device 11. Also, in the present embodiment, left-right directions (X axis), front-rear directions (Y axis), and up-down directions (Z axis) are set as shown in FIG. 1.

As shown in FIGS. 1 to 3, mounting device 11 is provided with board conveyance unit 12, mounting unit 13, component supply unit 14, imaging unit 16, and control device 40. Board conveyance unit 12 loads board S, conveys board S, fixes board S at a mounting position, and unloads board S. Board conveyance unit 12 includes a pair of conveyor belts provided extending in a left-right direction and separated in the front-rear direction of FIG. 1. Board S is conveyed by these conveyor belts.

Mounting unit 13 picks up component P from component supply unit 14 and mounts the component P on board S fixed by board conveyance unit 12. Mounting unit 13 is provided with head moving section 20, mounting head 22, and suction nozzle 28. Head moving section 20 is provided with sliders that move in XY directions guided by guide rails and motors that drive the sliders. Mounting head 22 is removably attached to a slider and is movable in the XY directions by head moving section 20. At least one suction nozzle 28 is removably attached to an underside of mounting head 22. As shown in FIG. 2, at least one long cylindrical syringe member 25 is provided on mounting head 22 to be rotatable around a center axis and to be movable in a vertical direction. Suction nozzle 28 is removably attached to the lower end of syringe member 25. Syringe member 25 to which suction nozzle 28 is attached corresponds to the raising and lowering member. Gear 26 is provided at the top end of syringe member 25. Mounting head 22 is provided with Q-axis motor 23 that includes gear 24. With Q-axis motor 23, gear 24 engages with gear 26, and by rotating syringe member 25 via gear 26, the angle of component P held by suction nozzle 28 is adjusted.

Suction nozzle 28 uses pressure to hold a component P at the nozzle tip and release the component P being held at the nozzle tip. Suction nozzle 28 includes disk-shaped flange 29, and pipe section 19 formed at the tip (refer to FIG. 2). Pipe section 19 is arranged in the main body of suction nozzle 28 so as to be slidable in the Z-axis direction (vertical direction). With mounting head 22, syringe member 25 and suction nozzle 28 are raised and lowered in the Z-axis direction at a single raising and lowering position positioned at the tip end in the Y-axis direction of mounting head 22. Note that, a pickup member for picking up component P is described here as suction nozzle 28, but the pickup member is not limited to this so long as it is capable of picking up component P, for example, a mechanical chuck that picks up component P by grabbing, or the like, may be used.

As shown in FIG. 2, mounting head 22 is provided with first raising and lowering drive section 30 and second raising and lowering drive section 34, and adjusts the height of suction nozzle 28 along the Z axis using first raising and lowering drive section 30 and second raising and lowering drive section 34. First raising and lowering drive section 30 is for raising and lowering the entire syringe member 25 to which suction nozzle 28 that picks up a component P is attached. First raising and lowering drive section 30 is provided with first linear motor 31 and first support member 32. First linear motor 31 moves first support member 32 up and down over movement range A, which is relatively long (refer to FIG. 2). First support member 32 is formed in the vertical direction and is supported by first linear motor 31. Second raising and lowering drive section 34 is arranged on the lower end of first support member 32. First engaging section 33 that engages with disk-shaped horizontal section 27 formed on syringe member 25 is formed on the lower end side of first support member 32. Second raising and lowering drive section 34 is for raising and lowering suction nozzle 28 of syringe member 25. Second raising and lowering drive section 34 is provided with second linear motor 35, second support member 36, second engaging section 37, and detecting section 38. Second linear motor 35 moves second support member 36 up and down over movement range B, which is relatively short compared to movement range A (refer to FIG. 2). Second support member 36 is formed in the vertical direction and is supported by second linear motor 35. Second engaging section 37 is formed on the lower end of second support member 36. Second engaging section 37 is engaged with flange 29 of suction nozzle 28. Second raising and lowering drive section 34, by the drive force of second linear motor 35, moves suction nozzle 28 up and down directly via second engaging section 37 and flange 29. Detecting section 38, which is a load cell, is arranged on second support member 36, such that detecting the load applied to second engaging section 37 is possible. Mounting head 22 lowers suction nozzle 28 at high speed using first raising and lowering drive section 30, and lowers suction nozzle 28 at low speed using second raising and lowering drive section 34, and performs drive control when component P contacts board S based on a detection result of detecting section 28, such that the load applied to component P is reduced. Mounting device 11 is provided with reference member 17 on which a reference surface used as the reference height is formed.

As shown in FIG. 1, component supply unit 14 is provided with multiple reels, and is removably attached to a front side of mounting device 11. Tape is wound on each reel and multiple components P are held in the surface of the tape in a lengthwise direction. The tape is unwound to the rear from the reel, and with a component P exposed, is fed by a feeder section to a pickup position at which the component P is picked up by suction nozzle 24.

Imaging unit 16 is for imaging suction nozzle 28 that is holding a component P from the side. Imaging unit 16 is provided with an imaging element, a mirror, and image processing section. Control device 40 detects items such as deviation of the pickup position of component P, deformation of component P, and damage using the image captured by imaging unit 16.

As shown in FIG. 3, control device 40 is configured from a microprocessor based around CPU 41, ROM 42 that memorizes a processing program, HDD 43 that memorizes various data, RAM 44 used as working memory, input/output interface 45 for performing communication of electric signals with external devices, and so on, and these are connected by bus 46. Control device 40 outputs control signals to board conveyance unit 12, mounting unit 13, component supply unit 14, and imaging unit 16, and receives signals from mounting unit 13, component supply unit 14, and imaging unit 16.

Management computer 50 manages information of each device of mounting system 10. Management computer 50 is provided with input device 52 such as a keyboard and mouse for an operator to input various commands, and display 54 for displaying various information.

Figure 4:
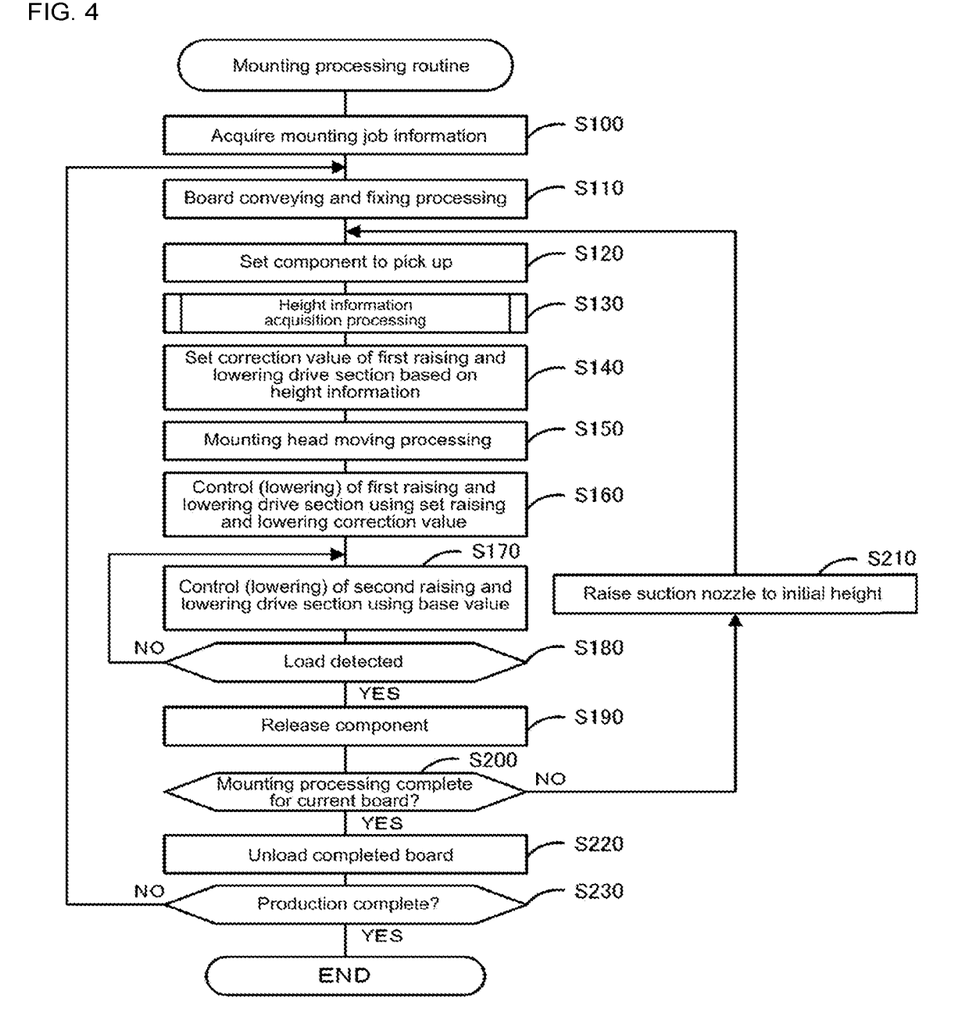
FIG. 4 is a flowchart showing an example of a mounting processing routine.

Next, operation of mounting system 10 of the present embodiment as configured above is described, specifically, mounting processing of mounting device 11. FIG. 4 is a flowchart showing an example of mounting processing performed by CPU 41 of control device 40. This routine is memorized on HDD 43 of control device 40 and is performed based on a start command from an operator. Here, descriptions are mainly given of a case in which components P are mounted on board S using suction nozzle 28 by way of two-step control of first raising and lowering drive section 30 and second raising and lowering drive section 34. When the routine is started, first, CPU 41 of control device 40 acquires mounting job information from management computer 50 (step S100). Included in mounting job information are the mounting order of components P, the types and characteristics of components P to be mounted, and information related to suction nozzle 28 used to pick up component P. Next, CPU 41 performs board S conveyance and fixing processing (step S110), and sets the component P to pick up (step S120). Then, CPU 41 performs processing to acquire height information including at least one of height information of board S and thickness information of component P (step S130).

Figure 5:
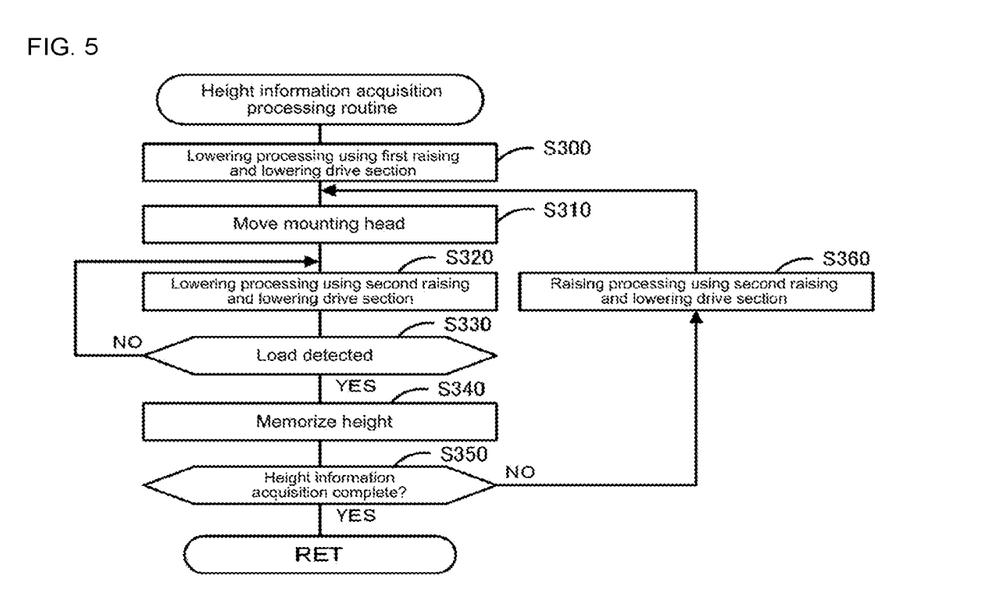
FIG. 5 is a flowchart showing an example of a height information acquiring and processing routine.
Figure 6:
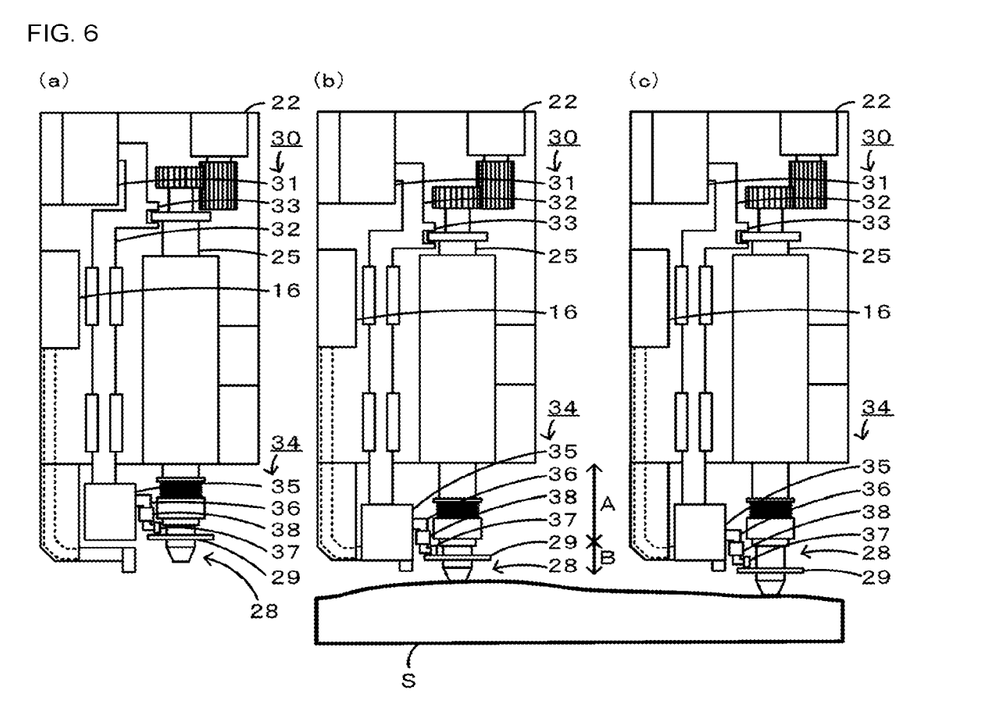
FIGS. 6(a), 6(b), and 6(c) show an example of measuring the height of board S.

FIG. 5 is a flowchart showing an example of a height information acquiring and processing routine. This routine is memorized on HDD 43 of control device 40. Here, control device 40, during raising and lowering control of syringe member 25, measures the height of board S and the thickness of component P by detecting contact with suction nozzle 28 using detecting section 38. First descriptions are given of processing for measuring the height of board S. There are cases in which board S is deformed, such as by warpage or unevenness. Here, control device 40 performs processing to measure the height of the upper surface of board S using detecting section 38 of mounting head 22. FIGS. 6(a), 6(b), and 6(c) show an example of measuring the height of board S, with FIG. 6(a) showing an initial state, and FIGS. 6(b) and 6(c) showing a measuring state after first raising and lowering drive section 30 has been lowered. Note that, suction nozzle 28 is used as the detecting member at the tip that finds out the height of board S, but instead of suction nozzle 28 a measuring jig may be attached to syringe member 25 and then processing be performed using the measuring jig.

When this routine is started, CPU 41 lowers first support member 32 using first raising and lowering drive section 30, and performs processing to lower the entire suction nozzle 28 and syringe member 25 (step S300). First raising and lowering drive section 30 lowers suction nozzle 28 to a specified reference height. Next, mounting head 22 is moved to a measurement point of board S (step S310). Measurement points, for example, may be multiple predetermined points in a lengthwise and widthwise direction such that deformation of board S can be identified. Also, the first measurement point is the upper surface (reference surface)

of reference member 17. CPU 41, for example, sets the reference surface of reference member 17 as an offset value based on an encoder value of second linear motor 35. Continuing, CPU 41 lowers second support member 36 slowly using second raising and lowering drive section 34 (step S320), and determines whether detecting section 38 detected a load being applied based on a signal of detecting section 38 (step S330). If detecting section 38 has not detected a load, CPU 41 continues processing of step S320, and if detecting section 38 has detected a load, the height from the reference surface is memorized in RAM 44 as the height at which suction nozzle 28 contacted the surface of board S (step S340). The height of the surface of board S, for example, can be obtained from an encoder value of first linear motor 31 or an encoder value of second linear motor 35. After step 340, CPU 41 determines whether all surface heights of board S have been acquired (measured) (step S350), and if not all have been acquired, CPU 41 raises suction nozzle 28 using second raising and lowering drive section 34 (step S360) and performs processing from step S310. On the other hand, if all the surface heights of board S have been acquired, CPU 41 ends the routine. In this manner, it is possible to measure the height of board S at each measurement point.

Figure 7:
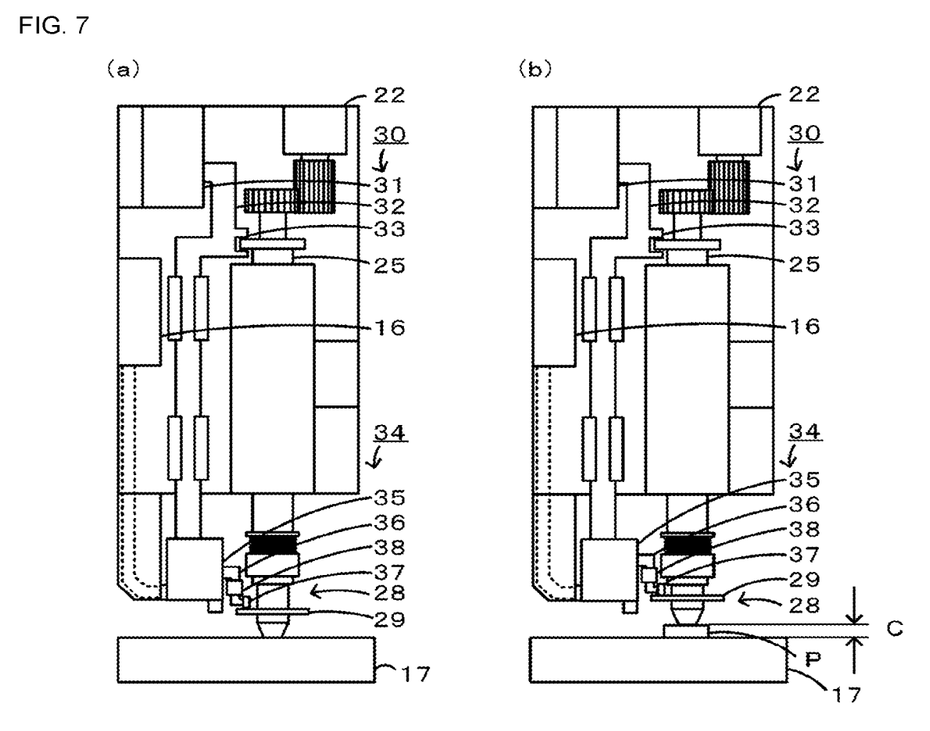
FIGS. 7(a) and 7(b) show an example of measuring the thickness of component P.

Next, descriptions are given of measuring the thickness (height) of component P. FIGS. 7(*a*) and 7(*b*) show an example of measuring the thickness of component P, with FIG. 7(*a*) showing measurement of a reference surface, and FIG. 7(*b*) showing measurement of the thickness of component P. With this processing, except for performing processing of contacting component P against the reference surface of reference member 17 with component P being held by suction nozzle 28 in step S320, processing is the same as with the above height measurement of board S. The thickness of component P can be obtained from the difference between the measurement value of the reference surface and the measurement value with component P being held (refer to thickness C of FIG. 7(*b*)). In this manner, it is possible to measure the thickness of component P.

Figure 8:
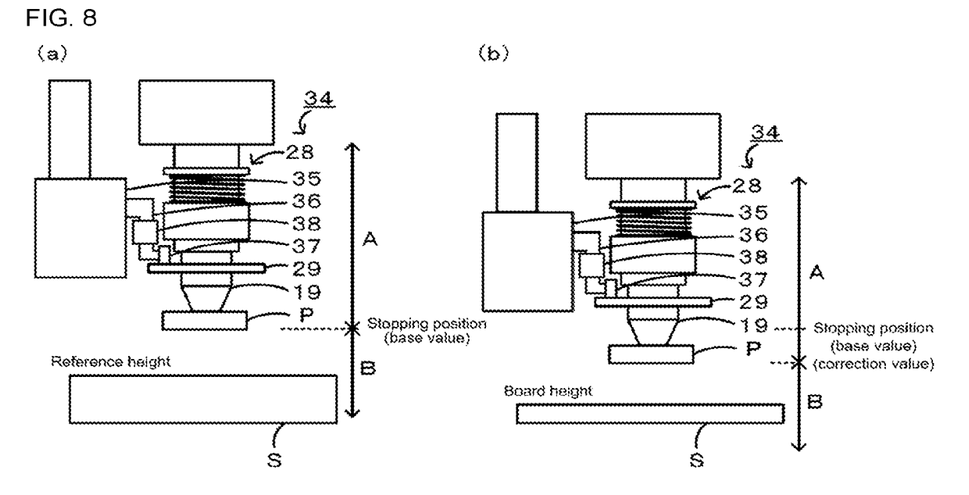
FIGS. 8(a) and 8(b) illustrate setting of a raising and lowering correction value of first raising and lowering drive section 30.

Returning to the mounting processing routine of FIG. 4, when the height information is acquired in step S130, CPU 41 sets a raising and lowering correction value of the first raising and lowering drive section based on the acquired height information (step S140). The raising and lowering correction value, for example, is a value correcting the stopping position of syringe member 25 above board S. Also, the raising and lowering correction value may be a value such that syringe member 25 stops at a position such that the distance between board S and syringe member 25 is a distance corresponding to a raising and lowering stroke (distance B) of suction nozzle 28 by second raising and lowering drive section 34. For example, the raising and lowering correction value may be a value such that, with the stroke of second raising and lowering drive section 34 being fixed, the stopping position of syringe member 25 by first raising and lowering drive section 30 is closer to board S in accordance with the height of board S and the thickness of component P. FIGS. 8(*a*) and 8(*b*) illustrate the setting of the raising and lowering correction value, with FIG. 8(*a*) showing the base value, and FIG. 8(*b*) showing the correction value. For this raising and lowering correction value, the lower the height of board S, the lower the stopping position of syringe member 25 by first raising and lowering drive section 30 corresponding to the height of board S, and the thinner the thickness of component P, the lower the stopping position by first raising and lowering drive section 30 corresponding to that thickness of component P (refer to FIG. 8(*b*)). In a similar manner, for the raising and lowering correction value, the higher the height of board S, the higher the stopping position of syringe member 25 by first raising and lowering drive section 30 corresponding to the height of board S, and the thicker the thickness of component P, the higher the stopping position by first raising and lowering drive section 30 corresponding to that thickness of component P. With mounting device 11, in a case in which second raising and lowering drive section 34 is raised and lowered without using height information, a relatively large margin is required for the stopping position of first raising and lowering drive section 30 such that component P does not strike board S. Therefore, the stroke of second raising and lowering device 34 becomes longer. Also, in a case in which height information is not used, when the height of board S is low, or the thickness of component P is smaller, the stopping position of first raising and lowering drive 30 must be relatively high such that component P does not strike board S; and the stroke of second raising and lowering drive section 34 must be even longer for the lower height of board S and the thinner thickness of component P. With mounting device 11, by using height information, it is possible to move the entire syringe member 25 to a position closer to board S in accordance with the height of board S and the thickness of component P, and the above margin can be made smaller.

After step S140, CPU 41 performs moving processing to move mounting head 22 to the arrangement position of component P (step S150), and controls first raising and lowering drive section 30 (first linear motor 31) using the set raising and lowering correction value (step S160). When syringe member 25 stops, CPU 41 performs lowering control of second raising and lowering drive section 34 (second linear motor 35) using the base value (step S170). Note that, here, CPU 41 performs lowering control of second raising and lowering drive section 34 after syringe member 25 has stopped, but second raising and lowering drive section 34 may be lowered before syringe member 25 has stopped. Continuing, CPU 41 determines whether a load has been detected by detecting section 38 (step S180), and if a load has not been detected, processing continues to step S170. On the other hand, if a load has been detected by detecting section 38, component P is considered to have contacted board S, and CPU 41 performs release of component P along with control of second raising and lowering drive section 34 such that the load is a specified mounting load (step S190). In this manner, because component P is arranged on board S using an output value of detecting section 38, it is possible to reduce the load applied to component P.

When component P has been released, CPU 41 determines whether mounting processing for the current board has been completed (step S200), and if it has not, raises suction nozzle 28 to its initial height using second raising and lowering drive section 34 (step S210), and performs processing from S120. That is, CPU 41 sets the next component to be picked up, acquires height information, and arranges the component P on board S while controlling first raising and lowering drive section 30 using the raising and lowering correction value based on the height information. On the other hand, if mounting processing of the current board is complete in step S200, CPU 41 unloads the completed board S (step S220) and determines whether production is complete (step S230). If production is not complete, CPU 41 performs processing from step S110. That is, CPU 41 conveys and fixes a new board, and performs processing from step S120. On the other hand, if production is complete in step S230, CPU 41 ends the routine.

Correspondences between constituent elements of the present embodiment and constituent elements of the disclosure will be clarified here. First raising and lowering drive section 30 of the present embodiment corresponds to the first raising and lowering section of the present disclosure, second raising and lowering section 34 corresponds to the second raising and lower section, suction nozzle 28 corresponds to the pickup member, syringe member 25 to which suction nozzle 28 is attached corresponds to the raising and lowering member, detecting section 38 and control section 40 correspond to the measuring section, and control device 40 corresponds to the control section. Also, mounting unit 13 and control device 40 correspond to the mounting processing unit of the present disclosure. Note that, with the present embodiment, an example of the present disclosure of a control method of a mounting device is clear from the description of operation of mounting device 11.

Mounting device 11 of the embodiment described above is provided with first raising and lowering drive section 30 configured to raise and lower the entire syringe member 25 (raising and lowering member) to which suction nozzle 28 that picks up component P is attached, and second raising and lowering drive section 34 that raises and lowers suction nozzle 28 only of syringe member 25 to which suction nozzle 28 is attached. And, mounting device 11 controls at least raising and lowering operation of first raising and lowering drive section 30 based on height information that includes at least one of information of the thickness of component P and information of the height of board S measured by detecting section 38 and control device 40. With mounting device 11, it is possible to move the entire syringe member 25 to which suction nozzle 28 is attached to a position closer to board S in accordance with the height of board S and the thickness of component P. Therefore, mounting device 11, in a configuration that raises and lowers syringe member 25 to which suction nozzle 28 is attached and that raises and lowers suction nozzle 28 itself, the raising and lowering stroke of suction nozzle 28 can be shortened. Thus, with mounting device 11, the unit can be made more compact.

Also, CPU 41, using the information of the board height and/or the component thickness included in the height information, controls raising and lowering operation of first raising and lowering drive section 30 such that syringe member 25 is positioned at a stopping position such that the distance between board S and syringe member 25 is a distance corresponding to a raising and lowering stroke of suction nozzle 28. Therefore, suction nozzle 28 can be brought closer to board S without changing the stroke of second raising and lowering drive section 34. Also, CPU 41 sets a raising and lowering section value that corrects the stopping position on board S of the raising and lowering member, and controls raising and lowering operation of first raising and lowering drive section 30 by correcting a base value using the raising and lowering correction value. Also, CPU 41 controls raising and lowering of second raising and lowering drive section 34 using the base value. Therefore, with mounting device 11, second raising and lowering drive section 34 performs raising and lowering according to the base setting, and first raising and lowering drive section 30 performs raising and lowering using the raising and lowering correction value, thus the raising and lowering stroke of suction nozzle 28 is shorter. Further, because CPU 41 measures the height of board S and the thickness of component P based on a detection result of detecting section 38, it is possible to measure the height of board S and the thickness of component P using detecting section 38 that detects a load applied to suction nozzle 28.

Meanwhile, it goes without saying that the disclosure is not limited to the above-mentioned embodiment and various embodiments may be applied within the technical scope of the disclosure.

For example, in the above embodiments, descriptions are given setting a raising and lowering correction value of first raising and lowering drive section 30, but in addition to this, it is possible to set a tip correction value used in raising and lowering control of suction nozzle 28 by second raising and lowering drive section 34 based on the height information. In mounting device 11, it is possible to set a raising and lowering correction value larger than the tip correction value based on the height information. With this mounting device 11, the position of the entire raising and lowering member is corrected, and the position of the pickup member is corrected by a smaller amount, such that the raising and lowering stroke of the pickup member is made even smaller. This tip correction value may be a correction value that corrects a reference position for a specified value in the raising and lowering range of suction nozzle 28 (such as a movement start position or a planned stop position), or may be a correction value that corrects the raising and lowering range of suction nozzle 28 itself. Also, the raising and lowering correction value may be a correction value that corrects a reference position for a specified value in the raising and lowering range of the raising and lowering member (such as a movement start position or a planned stop position), or may be a correction value that corrects the raising and lowering range of the raising and lowering member itself.

In the above embodiments, the height of board S and the thickness of component P are measured using detecting section 38, but the configuration is not limited to this. For example, the thickness of component P may be obtained using an image captured by imaging unit 16. Also, the height of each point on board S may be obtained using a laser-type distance measuring sensor. Or, the height of each point on board S may be obtained based on an image of board S captured from above. Or, the height of each point on board S may be obtained using a push stroke of or a pressure applied to a support pin that supports board S from below.

In the above embodiments, height information included both the height of board S and the thickness of component P, but the configuration is not limited to this, and at least one of these may be omitted. Even in this case, it is possible to shorten the raising and lowering stroke of suction nozzle 28 by one of the height of board S and the thickness of component P.

In the above embodiments, the present disclosure is described as mounting device 11, but the present disclosure may be, for example, a mounting processing unit provided with mounting unit 13 and control device 40, or a control method of mounting device 11, or a program run by a computer that performs the above processing.

INDUSTRIAL APPLICABILITY

The present disclosure may be used on a device that performs mounting processing of arranging components on a board.

REFERENCE SIGNS LIST

10: mounting system; 11: mounting device; 12: board conveyance unit; 13: mounting unit; 14: component supply unit; 16: imaging unit; 17: reference member; 19: pipe section; 20: head moving section; 22: mounting head; 23: Q-axis motor; 24, 26: gear; 25: syringe member; 27: horizontal section; 28: suction nozzle; 29: flange; 30: first raising and lowering drive section; 31: first linear motor; 32: first support member; 33: first engaging section; 34: second raising and lowering drive section; 35: second linear motor; 36: second support member; 37: second engaging section; 38: detecting section; 40: control device; 41: CPU; 42: ROM; 43: HDD; 44: RAM; 45: input/output interface; 46: bus; 50: management computer; 52: input device; 54: display; P: component; S: board

The invention claimed is:

1. A mounting processing unit for arranging components on a board, the mounting processing unit comprising:
   a first raising and lowering drive section configured to raise and lower an entire raising and lowering member to which a pickup member configured to pick up a component is attached;
   a second raising and lowering drive section configured to raise and lower the pickup member of the raising and lowering member; and
   a control section configured to control at least raising and lowering operation of the first raising and lowering drive section based on height information that includes at least one of component thickness information or information of board height measured by a measuring section before the component that is picked up by the pickup member comes into contact with the board,
   wherein the control section sets a tip correction value used for raising and lowering control of the pickup member by the second raising and lowering drive section based on the height information, sets a raising and lowering correction value larger than the tip correction value and to be used for raising and lowering control of the raising and lowering member by the first raising and lowering section, controls raising and lowering operation of the first raising and lowering drive section using the raising and lowering correction value, and controls operation of the second raising and lowering drive section using the tip correction value.

2. The mounting processing unit according to claim 1, wherein
   the control section, using the information of the board height or the component thickness, or both the board height and the component thickness, included in the height information, controls raising and lowering operation of the first raising and lowering drive section such that the raising and lowering member is positioned at a stopping position of the raising and lowering member which is such that a distance between the board and the raising and lowering member is a distance corresponding to a raising and lowering stroke of the pickup member.

3. The mounting processing unit according to claim 1, further comprising:
   a detecting section configured to detect a load applied to the pickup section, and wherein
   the control section, in raising and lowering control of the raising and lowering member or the pickup member or both, measures at least one of the board height or the component thickness by detecting contact with a member to which the raising and lowering member is attached using the detecting section.

4. A mounting processing unit for arranging components on a board, the mounting processing unit comprising:
   a first raising and lowering drive section configured to raise and lower an entire raising and lowering member to which a pickup member configured to pick up a component is attached;
   a second raising and lowering drive section configured to raise and lower the pickup member of the raising and lowering member; and
   a control section configured to control at least raising and lowering operation of the first raising and lowering drive section based on height information that includes at least one of component thickness information or information of board height measured by a measuring section before the component that is picked up by the pickup member comes into contact with the board,
   wherein the control section sets a raising and lowering correction value that corrects the stopping position on the board of the raising and lowering member based on the height information, controls raising and lowering operation of the first raising and lowering drive section by correcting a base value using the raising and lowering correction value, and controls raising and lowering operation of the second raising and lowering section using a base value.

5. A mounting device comprising the mounting processing unit according to claim 1.

6. A control method for a processing mounting unit for arranging components on a board, provided with a first raising and lowering drive section configured to raise and lower an entire raising and lowering member to which a pickup member configured to pick up a component is attached, and a second raising and lowering drive section configured to raise and lower the pickup member of the raising and lowering member, the control method comprising:
   a control step of controlling at least raising and lowering operation of the first raising and lowering drive section based on height information that includes at least one of information of component thickness or information of board height measured by a measuring section before the component that is picked up by the pickup member comes into contact with the board,
   wherein the control step includes setting a tip correction value used for raising and lowering control of the pickup member by the second raising and lowering drive section based on the height information, setting a raising and lowering correction value larger than the tip correction value and to be used for raising and lowering control of the raising and lowering member by the first raising and lowering section, controlling raising and lowering operation of the first raising and lowering drive section using the raising and lowering correction value, and controlling operation of the second raising and lowering drive section using the tip correction value.

7. A mounting device comprising the mounting processing unit according to claim 4.

* * * * *